United States Patent [19]

Einzinger et al.

[11] Patent Number: 4,677,325
[45] Date of Patent: Jun. 30, 1987

[54] HIGH VOLTAGE MOSFET SWITCH

[75] Inventors: Josef Einzinger, Unterschleissheim; Christine Fellinger, Unterhaching; Ludwig Leipold, Munich; Jenoe Tihanyi, Munich; Roland Weber, Munich, all of Fed. Rep. of Germany

[73] Assignee: Siemens Aktiengesellschaft, Berlin and Munich, Fed. Rep. of Germany

[21] Appl. No.: 872,354

[22] Filed: Jun. 9, 1986

[30] Foreign Application Priority Data

Jun. 12, 1985 [DE] Fed. Rep. of Germany ....... 3521090

[51] Int. Cl.⁴ .................. H03K 17/687; H03K 19/20; H03K 17/16; H03K 19/094
[52] U.S. Cl. .................................... 307/574; 307/443; 307/446; 307/451; 307/576
[58] Field of Search ........... 307/443, 451, 446, 200 B, 307/362, 363, 570, 572, 575, 576, 579, 584, 585, 450, 581, 574

[56] References Cited

U.S. PATENT DOCUMENTS

| T952,012 | 11/1976 | Lee | 307/451 |
| 3,823,330 | 7/1974 | Rapp | 307/214 |
| 4,064,405 | 12/1977 | Cricchi et al. | 307/205 |
| 4,326,136 | 4/1982 | Le Can et al. | 307/451 |
| 4,384,287 | 5/1983 | Sakuma | 307/451 |

FOREIGN PATENT DOCUMENTS

| 0136726 | 10/1980 | Japan | 307/451 |
| 0079822 | 5/1985 | Japan | 307/443 |

Primary Examiner—Stanley D. Miller
Assistant Examiner—Trong Quang Phan
Attorney, Agent, or Firm—John Francis Moran

[57] ABSTRACT

A switching circuit includes two series-connected MOSFET (1, 6) complementing one another, which are interconnected at the drain terminal of each device. The gate terminal of the MOSFET that is grounded is connected to a control input terminal (E). This gate terminal is also connected to the source terminal of a depletion FET (7). The drain terminal of the depletion FET (7) is connected to the gate terminal of the second MOSFET (6) and, in turn, is connected via a resistor (8) to a voltage source (+U). The gate terminal of the depletion FET (7) is grounded. The load (5) is then connected to the drain side of the complementary MOSFET. When the switch is in a blocking condition, the cross current is thus prevented from flowing; and the FET connected to voltage can be completely activated.

4 Claims, 2 Drawing Figures

HIGH VOLTAGE MOSFET SWITCH

BACKGROUND OF THE INVENTION

This invention relates to electronic switches, and, it relates more particularly, to electronic switches having the following characteristics:

(a) the drain-to-source paths of a first metal oxide semiconductor and second MOSFET are series connected;

(b) the junction of both MOSFETs is connected to an output terminal;

(c) a resistor is serially connected to a third MOSFET;

(d) the junction between the resistor and the third MOSFET is connected to the gate terminal of the second MOSFET;

(e) the gate terminal of the first MOSFET is connected to a first of two control input terminals.

An electronic switch of this general type is known and has been described as such. In connection with this type of switch, compare an article by Messrs. M. Pomper, L. Leipold, R. Weidlich entitled "High-Voltage ESFI-SOS Circuits for LCD-Driver Applications"; ESSCIRC '77, ULM, Digest of Technical Papers, pp. 176-178.

Such a conventional circuit is illustrated in FIG. 1. This arrangement includes two n-type channel MOSFETs 1 and 2 whose drain-to-source paths are serially connected together. The source terminal S of MOSFET 1 is grounded, and the drain terminal D of the FET 2 is connected to the supply voltage +U. The junction of both MOSFETs is connected to an output terminal A of the electronic switch. Further, the electronic switch is provided with the series connection of a third n-type channel MOSFET 3 with a depletion FET 4.

The depletion FET 4 is connected to the supply voltage +U, and the source terminal S of MOSFET 3 is at ground potential. The drain terminal D of MOSFET 3 is connected to the gate terminal G of the second MOSFET 2. The gate terminal G of MOSFET 3 is connected to an input terminal E which is also connected to the gate terminal of MOSFET 1. The other input terminal M is at ground potential.

When a signal with a level H, for example, of +5 V is connected to the input terminal E, MOSFET 3 is energized and starts conducting. This signal also turns on MOSFET 1 to assume the conductive state. The gate terminal and the source connection of MOSFET 2 are then effectively connected to a ground potential, so that this MOSFET is thus blocked and remains off. The output A is also connected to a ground potential, and the electronic switch is thus deenergized. However, a current flows through MOSFET 3 and depletion FET 4 acting as a resistor while the switch is in this blocking state.

In the event that a voltage level L, e.g., 0 V is applied to the input terminal E, MOSFETs 3 and 1 will be blocked or turned off. Consequently, the voltage at the gate terminal of MOSFET 2 increases, and this MOSFET commences to conduct. A current will thus flow to the output of the electronic switch. This, however, means that the voltage at the output terminal A and, consequently, at the source terminal of MOSFET 2, will increase. If at the output end, for example, a power MOSFET 5 is located, the voltage at the source terminal of MOSFET 2 is increased in accordance with the charge of the gate capacitances of MOSFET 5.

As the voltage at the gate terminal of MOSFET 2 does not increase beyond +U, the gate source voltage $U_{GS}$ will decrease steadily. Thus, the current flowing through MOSFET 2 also decreases, so that MOSFET 5 is only able to be energized or activated to conduct slowly. The maximum attainable gate voltage for MOSFET 5 is connected at the voltage +U, minus the starting voltate $+U_T$ of MOSFET 2.

SUMMARY OF THE INVENTION

It is an object of the present invention to improve over conventional electronic switches in such a way that no current flows during a blocking condition and that the load current of the switch, irrespective of the type of load or charging condition, becomes a capacitive load.

This problem is solved according to the inventive principles in a switching arrangement having the following characteristics:

(f) a first MOSFET and a second MOSFET are enhancement FETs, and they have channel types which complement one another;

(g) the first MOSFET and the second MOSFET have common interconnection drain corresponding to the drain terminal of each device;

(h) a third MOSFET is a depletion FET of the same channel type as the second MOSFET;

(i) the gate terminal of the third MOSFET is connected to a source terminal of the first MOSFET and to the second input terminal; and (j) the source terminal of the third MOSFET is connected to the first input terminal.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 2:
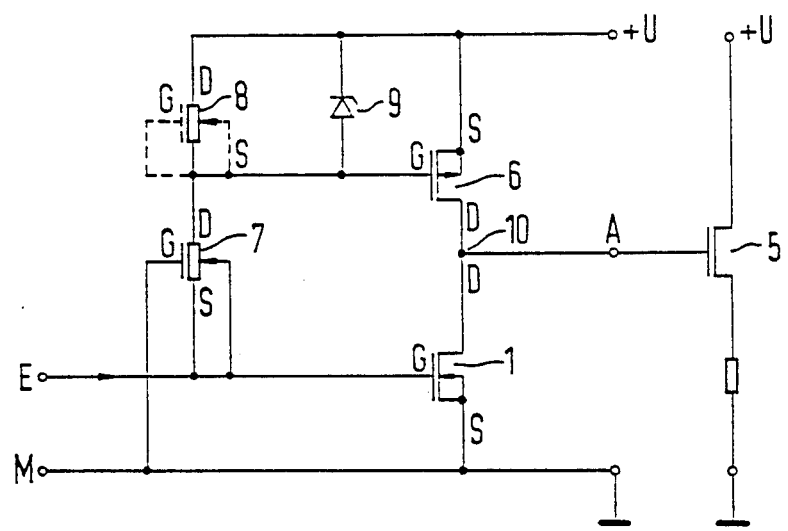
FIG. 2 is a circuit diagram of an illustrative embodiment of the invention which provides improved performance over conventional electronic switches.

In FIG. 2, the electronic switch includes two MOSFETs 1 and 6 whose drain source paths are serially connected together. When the electronic switch is connected to a positive voltage +U, the first MOSFET 1, as is the case with conventional switches of this type, is an n-type channel FET. Then the second MOSFET 6 is a p-type channel FET. If a negative voltage is to be connected, the FET 1 is a p-type channel, and the FET 6 an n-type channel FET. The FETs 1 and 6 are interconnected at the drain side, and the junction 10 is connected to the output terminal A. The gate terminal of FET 1 is located at the first input terminal E. Further, this gate terminal is connected to the source terminal of a depletion FET 7 whose gate electrode is connected to the second input terminal M or grounded. The drain terminal of the FET 7 is connected via a resistor 8 to the supply voltage source +U. The resistor 8 can, as is indicated with dotted lines, also be another depletion FET whose gate terminal is shorted with the source terminal. This transistor then acts like a current source with an infinite high internal resistance.

The depletion FETs 7 and 8 have n-conducting channels. If a negative voltage is to be connected, it is necessary to use depletion FETs with p-type channels.

When a signal with a level H, for example, of +5 V is applied across input terminals E, M, the FET 1 will be activated or turned on and the output A is connected to the ground potential. The FET 7 then receives a negative gate bias and will be blocked or turned off. Thus, a high voltage is applied to the drain terminal of the FET 7 and the gate terminal of the FET 6, whereby the FET 6 will be blocked. The electronic switch is thereby blocked, and neither will load current flow to the user 5 nor cross current through resistor 8 and FET 7.

Figure 1:
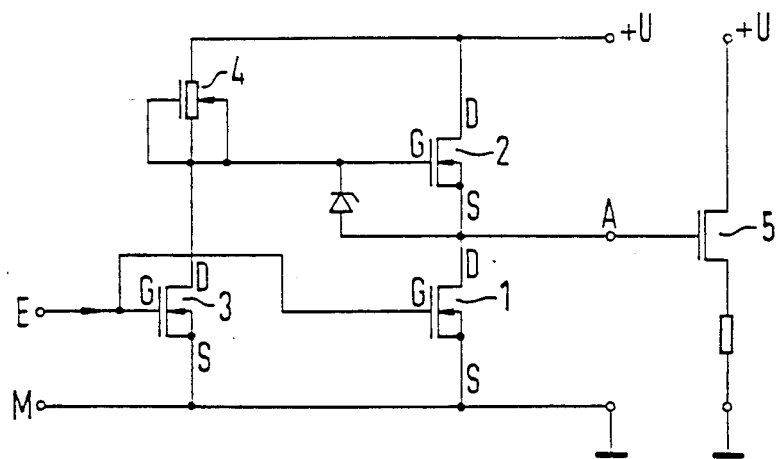
FIG. 1 is a circuit diagram of a typical conventional electronic switch.

When a signal with the level L, for example, of 0 V is applied at the input E, M, the FET 1 will be blocked and the depletion FET 7 will be supplied with the gate source voltage 0 V. As a result, this FET 7 is energized, and a current will flow through resistor 8 and FET 7. At the gate terminal of the p-type channel FET 6, a voltage will then arise which is determined by the ratio of voltage division between resistor 8 and FET 7. This voltage is positive and remains constant. In comparison with the conventional circuit of FIG. 1, the source terminal of FET 6 in FIG. 1, unlike FET 2 of FIG. 1, is connected to a constant voltage. This enables the electronic switch to be energized very quickly, and a capacitive load, for example, such as the large gate capacitance of a power FET, applied at the output terminal A can be charged very quickly.

The gate source path of the MOSFET 6 can be protected against voltages in the usual manner, for example, by means of Zener diodes.

There has thus been shown and described a novel electronic switch which fulfills all the objects and advantages sought therefor. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

We claim:
1. An electronic switch comprising:
    (a) a first MOSFET and a second MOSFET having drain-to-source paths serially connected together;
    (b) an output terminal of the switch is connected to the junction of both MOSFETs;
    (c) a third MOSFET and a resistor are serially connected together;
    (d) the junction between the resistor and the third MOSFET is connected to the gate terminal of the second MOSFET;
    (e) the gate terminal of the first MOSFET is connected to a first of two control input terminals;
    (f) the first MOSFET and the second MOSFET are enhancement FETs, and they have channel conductivity types which complement one another;
    (g) the first and the second MOSFET are interconnected at the drain side of each MOSFET;
    (h) the third MOSFET is a depletion FET of the same channel conductivity type as the first MOSFET;
    (i) the gate terminal of the third MOSFET is connected to a source terminal of the first MOSFET and the second of the two control input terminals; and
    (j) the source terminal of the third MOSFET is connected to the first of the two control input terminals.
2. An electronic switch according to claim 1, wherein the resistor is another depletion MOSFET of the same channel conductivity type as the first MOSFET, and the gate terminal and the source terminal of the other depletion MOSFET are interconnected.
3. An electronic switch in accordance with claim 1, further comprising a Zener diode coupled between the gate terminal and source terminal of the second MOSFET.
4. An electronic switch in accordance with claim 2, further comprising a Zener diode coupled between the gate terminal and source terminal of the second MOSFET.

* * * * *